United States Patent
Arimoto

(10) Patent No.: US 8,136,730 B2
(45) Date of Patent: Mar. 20, 2012

(54) STORAGE MEDIUM CONNECTING DEVICE AND INFORMATION DEVICE EQUIPPED WITH THE SAME

(75) Inventor: Hideki Arimoto, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 948 days.

(21) Appl. No.: 11/583,742

(22) Filed: Oct. 20, 2006

(65) Prior Publication Data

US 2007/0090187 A1    Apr. 26, 2007

(30) Foreign Application Priority Data

Oct. 20, 2005 (JP) .................... 2005-306132

(51) Int. Cl.
*G06K 7/06* (2006.01)
(52) U.S. Cl. .................... 235/441; 235/435; 235/439
(58) Field of Classification Search .......... 235/435, 235/439, 441, 487, 492
See application file for complete search history.

(56) References Cited

U.S. PATENT DOCUMENTS

| | | | | |
|---|---|---|---|---|
| 6,015,311 | A * | 1/2000 | Benjamin et al. | 439/267 |
| 6,457,647 | B1 * | 10/2002 | Kurihashi et al. | 235/486 |
| 6,468,101 | B2 * | 10/2002 | Suzuki | 439/326 |
| 6,540,523 | B1 * | 4/2003 | Kung et al. | 439/64 |
| 6,761,320 | B1 * | 7/2004 | Chen | 235/492 |
| 6,945,461 | B1 * | 9/2005 | Hien et al. | 235/451 |
| 2001/0039129 | A1 * | 11/2001 | Nishimura | 439/74 |
| 2004/0070952 | A1 * | 4/2004 | Higuchi et al. | 361/737 |
| 2005/0258243 | A1 * | 11/2005 | Hsieh | 235/441 |
| 2006/0065729 | A1 * | 3/2006 | Miyairi | 235/441 |
| 2007/0007346 | A1 * | 1/2007 | Lin | 235/441 |

FOREIGN PATENT DOCUMENTS

| | | |
|---|---|---|
| JP | 3-105587 A | 5/1991 |
| JP | 5-78586 | 10/1993 |
| JP | 11-216974 | 8/1999 |
| JP | 2000-260531 A | 9/2000 |
| JP | 2001-313107 A | 11/2001 |
| JP | 2003-249314 | 9/2003 |
| JP | 5-78586 | 10/2003 |
| JP | 2004-310496 A | 11/2004 |
| JP | 2005-150183 | 6/2005 |

OTHER PUBLICATIONS

JP Office Action dtd Jul. 28, 2009, JP Appln. 2005-306132, partial English translation.
Fig. 16, filed in original JP priority application No. 2005-306132, filed Oct. 20, 2005. News Release, "Brother Announces New Low-Profile Color Multi-Function Center Models for Personal or Home Office Use," Brother International Corporation, Aug. 3, 2004, 6 pages.
User's Guide, MFC-210C and MFC-420CN, Brother International Corporation, Section 9-3 Walk-Up Photocapture Center, release date Jun. 25, 2004, 11 pages.
User's Guide, MFC-620CN, Brother International Corporation, Section 10-3 Walk-Up Photocapture Center, release date Jul. 15, 2004, 11 pages.

* cited by examiner

*Primary Examiner* — Daniel Hess
*Assistant Examiner* — Matthew Mikels
(74) *Attorney, Agent, or Firm* — Banner & Witcoff, Ltd

(57) ABSTRACT

A storage medium connecting device which enables electrical connection of a card-type storage medium with a substrate via a socket is provided. The storage medium connecting device includes an exterior member having an insertion port for allowing the card-type storage medium to be inserted into the socket; a connection section provided in a vicinity of the insertion port for connecting the socket to the substrate; and a cover member which extends from the insertion port in a direction of inserting the card-type storage medium and covers the connection section, the cover member being provided on the exterior member.

12 Claims, 15 Drawing Sheets

STORAGE MEDIUM CONNECTING DEVICE AND INFORMATION DEVICE EQUIPPED WITH THE SAME

CROSS-REFERENCE TO RELATED APPLICATION

This application claims priority from Japanese Patent Application No. 2005-306132, filed on Oct. 20, 2005, the entire subject matter of which is incorporated herein by reference.

TECHNICAL FIELD

Aspects of the present invention relate to a storage medium connecting device which enables electrical connection of a card-type storage medium, such as a memory card, with a substrate via a socket mounted on a substrate, as well as to an information device equipped with the connecting device.

BACKGROUND

A so-called memory card (an example of a card-type storage medium) formed by packaging nonvolatile memory, such as flash memory, into the shape of a card has widely been known. Information devices including printers and multifunction devices, which are each integrally equipped with a connecting device (an example of a storage medium connecting device) for enabling electrical connection with a memory card, have recently been available on the market. In such an information device, data can be exchanged between the memory card and the information device without using a PC (Personal Computer) by directly connecting the memory card with the information device.

Specifications of the memory cards have not been unified yet, and a plurality of standards (memory card standards) are now present. Typical memory cards commercially produced in accordance with the plurality of standards include; Compact Flash (registered trademark, and hereinafter abbreviated as "CF"); SmartMedia (registered trademark, and hereinafter abbreviated as "SM"); Memory Stick (registered trademark, and hereinafter abbreviated as "MS"); an SD memory card (registered trademark, and hereinafter abbreviated as "SD"); an XD card (registered trademark, and hereinafter abbreviated as "XD").

These types of memory cards differ from each other in terms of the shape of a connection terminal, the number of terminals, or the sizes and shapes of the memory cards. Therefore, the information device is provided with slots and sockets compatible with the respective memory cards in order to enable connection of the respective types of memory cards.

A socket mounted on a substrate has a plurality of terminals connected to a plurality of terminals on the substrate. When a memory card is inserted into the socket, a plurality of terminals of the memory card are connected to the terminals of the socket. Thus, the memory card is electrically connected with the substrate via the socket.

Various proposals regarding countermeasures against static electricity discharged when a memory card is inserted into the socket have been made, as disclosed in JP-A-2005-150183 and JP-A-2003-249314.

SUMMARY

Aspects of the present invention provide a storage medium connecting device which enables prevention of discharge of static electricity to terminals or influence of an extraneous surge, such as an electromagnetic wave, with a simple configuration when the terminals are positioned in the vicinity of an insertion port for a card storage medium, as well as an information device equipped with the connecting device.

DETAILED DESCRIPTION

General Overview

Figure 1:
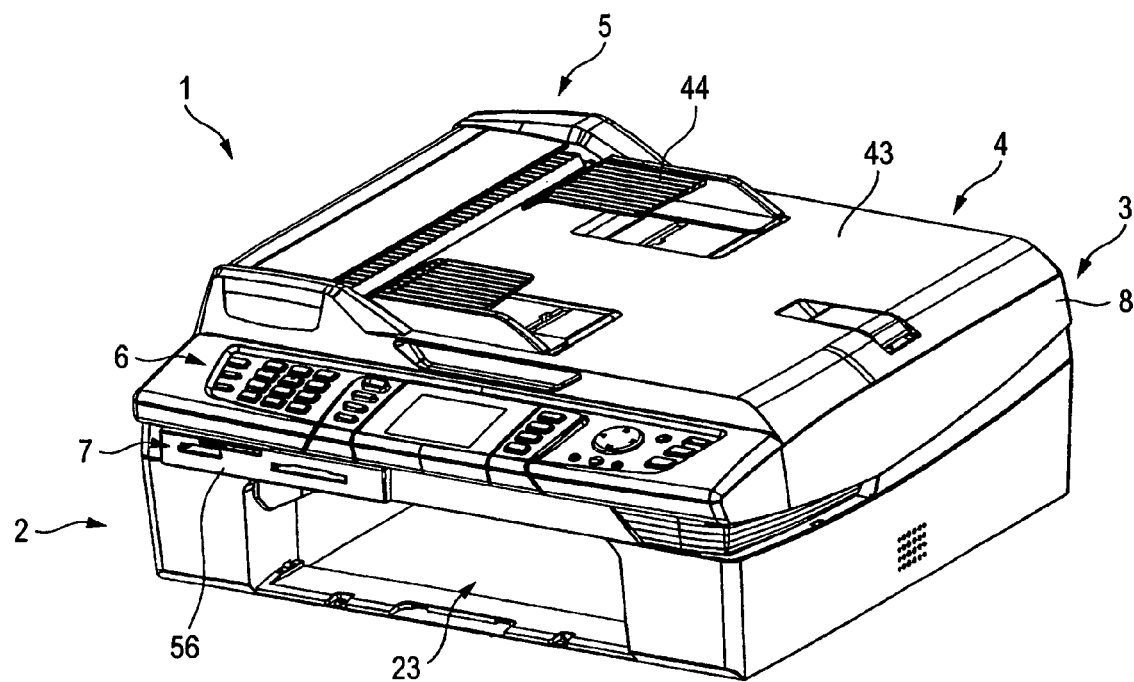
FIG. 1 is a perspective view showing an external configuration of a multifunction device according to an aspect of the present invention.

According to an aspect of the present invention, there is provided a storage medium connecting device which enables electrical connection of a card-type storage medium with a substrate via a socket. The storage medium connecting device comprises an exterior member having an insertion port for detachably inserting the card-type storage medium into the socket; a connection section provided in a vicinity of the insertion port for connecting the socket to the substrate; and a cover member which extends from the insertion port in a direction of inserting the card-type storage medium and covers the connection section, the cover member being provided on the exterior member.

When the card-type storage medium, such as a memory card, is removably attached to the storage medium connecting device, the user's fingers approach the insertion port. At this time, when the user's human body has been charged with static electricity, there sometimes arise a case where static electricity is discharged to the connection section provided in the vicinity of the insertion port when the fingers are caused to approach the insertion port in order to remove the memory card or when the memory card is caused to approach the insertion port in an attempt to insert the card. Also, when a document or a recording sheet charged with static electricity is caused to approach the insertion port, the discharge of static electricity might be induced by the connection section. Since the static electricity discharged from the human body, the document, or the recording sheet has a voltage (a surge voltage) as high as several kilovolts, discharge of such static electricity induces failure of a semiconductor element mounted on the substrate or faulty operations of an electronic device. In some cases, the static electricity induces burning of conductive patterns on a substrate or crash of a memory card.

As a countermeasure for protecting the device from a surge voltage originating from discharge of static electricity, an over-voltage circuit including a varistor could be mounted on the substrate. However, provision of overvoltage protection circuits capable of protecting a plurality of terminals and all of patterns extended from the terminals from an overvoltage is not realistic. Therefore, prevention of occurrence of discharge of static electricity is conceived to be the best countermeasure. In the storage medium connecting device, even when the finger or memory card charged with static electricity or another charged body has been caused to approach the insertion port, the connection section that induces occurrence of static electricity is shielded by the cover member, and hence discharge of static electricity is prevented.

The cover member may guide the insertion of the card-type storage medium into the socket. The cross-sectional portion of the insertion port formed in the cover could be made broader by increasing the thickness of the exterior member, to thereby guide the memory card inserted into the insertion port in the inserting direction. According to an aspect of the present invention, the cover member functions to guide the insertion of the card-type storage medium, whereby smooth removal/insertion of the card-type storage medium in addition to prevention of discharge of static electricity can be realized by a single cover member. Moreover, a necessity for increasing the thickness of the exterior member is eliminated, and the thickness of the exterior member can be reduced. Hence, the outer dimension of the storage medium connecting device can be reduced by an amount corresponding to the reduced thickness.

The cover member may be formed integrally with the exterior member. As a result, a necessity for additionally providing a cover member as a separate member is eliminated, which results in reduction of the number of components.

A substrate on which the connection section is provided in the vicinity of the insertion port is generally designed when the socket individually relays an electrical connection between the substrate and a plurality of card-type storage media of different types inserted by way of the one insertion port. An aspect of the present invention is applied to a storage medium connecting device whose substrate is designed as mentioned above.

When contact sections which respectively contact with the plurality of card-type storage media in the sockets are arranged offset from each other according to types of the plurality of card-type storage media in the inserting direction of the card storage media, a connection section of the card-type storage medium whose contact section is located at the insertion port side is provided in the vicinity of the insertion port.

According to another aspect of the invention, there is provided an information device equipped with the storage medium connecting device. In the information device, such as a scanner, a copier, or the like, a sheet-shaped member, such as an OHP or paper sheet which is readily charged by static electricity, is handled. Therefore, discharge of static electricity, which would otherwise be caused by means of causing the sheet-shaped member to approach the insertion port, can be effectively prevented.

[Illustrative Aspects]

Now, an aspect of the present invention will be described with reference to the drawings. FIG. 1 is a perspective view showing an external configuration of a multifunction device 1 (an example of an information device) according to the aspect of the invention. The multifunction device (MFD) 1 integrally comprises a printer section 2 provided in a lower portion of the device; a scanner section 3 disposed above the printer section 2; a document cover 4 disposed above the scanner section 3; a control panel 6 disposed at a front-side of an upper surface of the device; and a slot section 7 (an example of a storage medium connecting device) formed in a front surface of the device. The multifunction device 1 has various types of functions, such as a printer function, a scanner function, a copy function, and a facsimile function. However, the present invention is not limited to a device having the plurality of functions. The present invention is applicable to a device having any one of the functions; for example, a scanner having only the scanner function, a printer having only the printer function, a copier having only the copying function, and a facsimile having only a facsimile function.

The multifunction device 1 is directly connected to an external device (not shown), such as a PC (Personal Computer), a memory card (an example of a card-type storage medium), and USB (Universal Serial Bus) memory, to thus record an image or a document on a recording sheet through the use of the printer section 2 based on recording data, including image data and document data, transmitted from the external device. The multifunction device 1 can also transfer the image data read by the scanner section 3 to the external device. Moreover, the multifunction device 1 can also perform so-called copying function of recording the image read by the scanner section 3 through the use of the printer section 2 without exchanging the data with the external device. Furthermore, the multifunction device 1 acts as a peripheral device which enables an access to the memory card connected to the multifunction device 1 from the PC in a state where the multifunction device 1 is connected with the PC so as to be able to transmit data. Individual sections of the multifunction device 1 will be described hereinbelow. The configuration of the multifunction device 1 described below is a mere example of information device. The configuration of the multifunction device 1 can be altered without departing from the scope of the present invention.

(Control Panel)

The control panel 6 used for operating the printer section 2 and the scanner section 3 is provided at a front-side of an upper surface of the multifunction device 1 and in front of the scanner section 3. Various operation keys and a liquid-crystal display section are arranged in the control panel 6. The multifunction device 1 is controlled so as to operate in accordance with a command input by way of the control panel 6. When the multifunction device 1 is connected to a computer as mentioned previously, the multifunction device 1 is operated in accordance with a command transmitted from the computer via a printer driver, a scanner driver, or the like.

(Slot Section)

The slot section 7 enables insertion of various compact memory cards serving as storage media and is formed in an upper left portion of the front of the multifunction device 1. This multifunction device 1 reads image data stored in a compact memory card inserted into the slot section 7; displays information about the image data on the liquid-crystal display section of the control panel 6; and enables the printer section 3 to record an arbitrary image on a recording sheet. Input operations for this purpose can be performed by way of the control panel 6. The various compact memory cards can be used for another application in addition to storing data to be recorded on a recording sheet.

Figure 5:
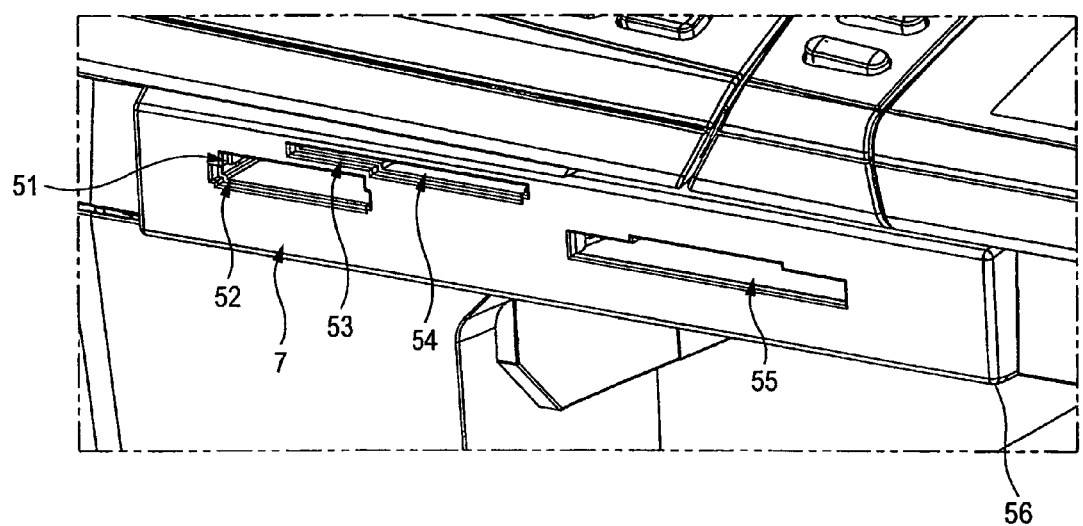
FIG. 5 is an enlarged view of a slot section.

As shown in FIG. 5, the slot section 7 has a first slot 51 used for insertion of an MS (a memory stick: a registered trademark), a second slot 52 used for insertion of an SD (an SD card: a registered trademark); a third slot 53 used for insertion of an SM (a SmartMedia: a registered trademark); a fourth slot 54 used for insertion of an XD (an XD card: a registered trademark); and a fifth slot 5 used for insertion of a CF (Compact Flash: a registered trademark). Of these slots, the first through fourth slots 51 to 54 are provided in a socket 75 (see FIG. 11) mounted on a control board 74 (see FIG. 11), and the fifth slot 55 is provided in a socket 76 (see FIG. 11) mounted on the control board 74. The above-described respective memory cards are examples of the card storage media.

Figure 6:
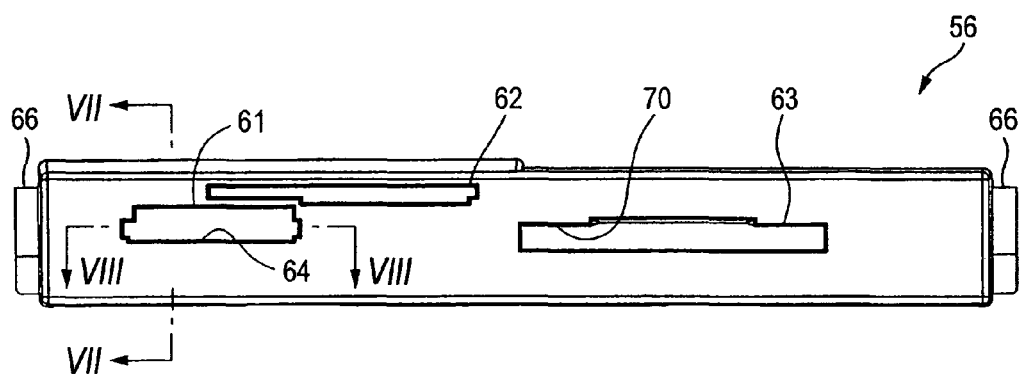
FIG. 6 is a front view of a cover.

A cover 56 (an example of an exterior member) constitutes the surface of the slot section 7. The cover 56 is fitted into a main body casing of the multifunction device 1. As shown in FIG. 6, first through third insertion ports 61 to 63 are formed in the cover 56. The first insertion port 61 is used for insertion of the SD and the SM into the first and second slots 51, 52. The second insertion port 62 is used for insertion of the MS and the XD into the third and fourth slots 53, 54. The third insertion port 63 is used for insertion of the CF into the fifth slot 55. The cover 56 constitutes an exterior of the multifunction device 1 and has the function of covering the control board 74 (see FIG. 11) located at the inside of the slot section 7 and sockets 75, 76 (see FIG. 11) mounted on the control board 74 and blocking intrusion of dust into the device or an extraneous surge such as static electricity, electromagnetic waves, or the like. Labels for the memory cards which can be inserted into the respective slots 51 to 55 are provided on the surface of the cover 56, whereby the cover 56 also functions as a name plate. The structure of the cover 56 will be described later.

(Document Cover)

As shown in FIG. 1, the document cover 4 has an ADF (Auto Document Feeder: an automatic document transport mechanism) 5 for automatically and consecutively transporting a document from a document tray 43, on which documents are piled up, to a document discharge tray 44 by way of a predetermined transport path. In the transport path of the ADF 5, a document passes over a reading face 14 (see FIG. 2) on platen glass 10, and an image-reading unit 16 reads an image of the document at a position below the reading face 14.

(Scanner Section)

Figure 2:
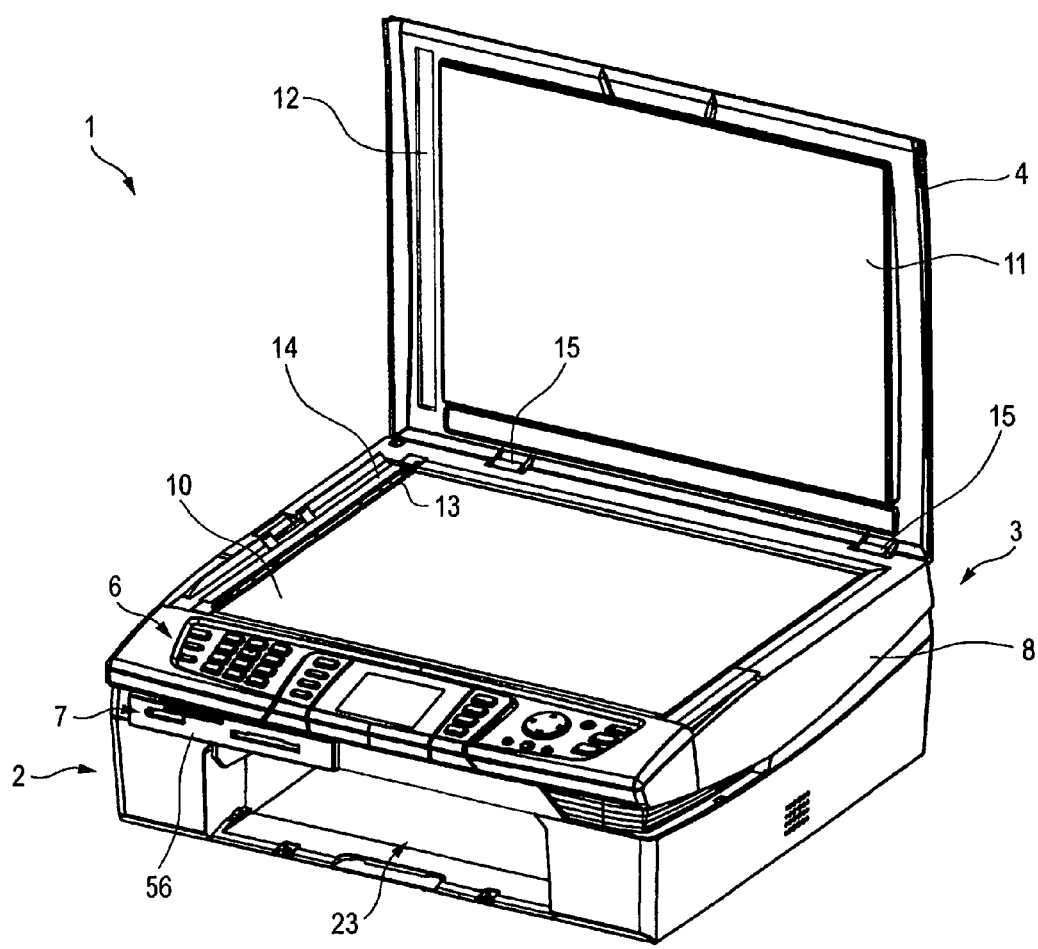
FIG. 2 is a perspective view showing the external configuration of the multifunction device 1 whose document cover is opened.

As shown in FIGS. 1 and 2, the scanner section 3 has a document reading table 8 which acts as an FBS (Flat Bed Scanner). The document cover 4 equipped with the ADF 5 is attached to the document reading table 8 via a hinge 15 on the back so that the document cover 4 can be opened and closed. FIG. 2 is a perspective view showing a state where the document cover 4 is opened.

The document reading table 8 constitutes a portion of the casing of the multifunction device 1, thereby forming a portion of an upper surface of the device. As shown in FIG. 2, the platen glass 10 is positioned on the upper surface of the document reading table 8 opposing the document cover 4. When the document cover 4 remains closed as shown in FIG. 1, the platen glass 10 is covered with the document cover 4. In this state, the document cover 4 forms a portion of the upper surface of the device.

As shown in FIG. 2, in order to press the document set on the platen glass 10, a document press member 11 formed from a sponge or a plate member is provided on the bottom surface of the document cover 4; namely, the face of the document cover 4 opposing the platen glass 10. In order to acquire stable light reflected from the document, the entirety of the document press member 11 may be given a single color such as white.

In order to make the document exposed to the predetermined reading face 14 of the platen glass 10 during reading of the document performed by the ADF 5 and return the document to the inside of the ADF 5 after reading, an opening 12 is formed in one end of the bottom surface of the document cover 4. One end of the platen glass 10 reaches the vicinity of a lower end of the opening 12. A reference plate 13 is disposed away a predetermined width from the one end of the platen glass 10. The interval of this predetermined width forms the reading face 14 employed during reading operation performed by means of the ADF 5.

When the scanner section 3 is used as an FBS, the document is placed on the platen glass 10. The platen glass 10 is formed from, e.g., a clear, colorless glass plate. The reference plate 13 is provided on the upper surface of the platen glass 10. This reference plate 13 is used for determining a position where the document is placed when the scanner section 3 is used as the FBS. The reference plate 13 is a long, flat member provided so as to extend rearwards (main scanning direction) of the platen glass 10 when viewed from the front. Markings showing the center position and positions of both ends of respective documents of various sizes, such as a A4-size, a B5-size, and the like are provided on the upper surface of the reference plate 13. A guide face is formed on the upper surface of the reference plate 13, for scooping up the document that is being transported by the ADF 5 so as to pass over the platen glass 10, to thus return the document to the inside of the ADF 5.

Figure 3:
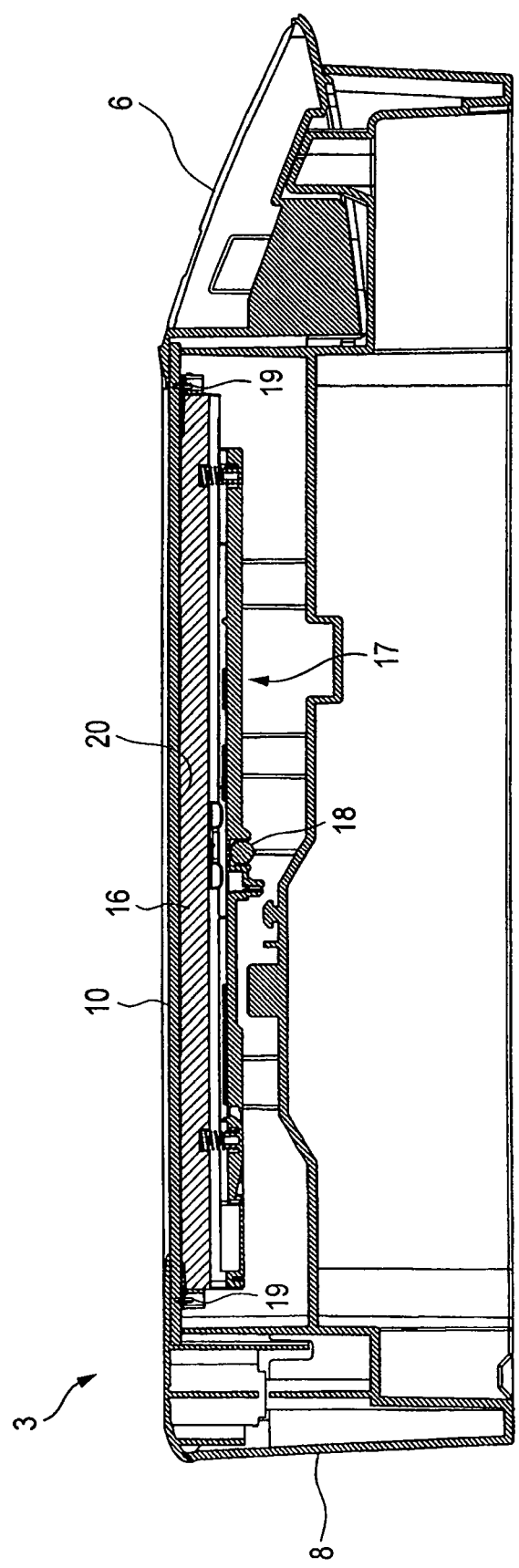
FIG. 3 is a schematic cross-sectional view showing a scanner section.

As shown in FIG. 3, the image reading unit 16 disposed opposite the platen glass 10, a carriage 17 supporting the image reading unit 16, a guide shaft 18, roller units 19, and the like, are provided in the document reading table 8. The guide shaft 18 is provided so as to extend in a direction perpendicular to the sheet of FIG. 3 (i.e., a sub-scanning direction). The carriage 17 is linked with the guide shaft 18, and supported so as to be slidable in a direction perpendicular to the sheet. When being driven by means of a belt drive mechanism (not shown), the carriage 17 is reciprocally moved in the sub-scanning direction at a position below the platen glass 10 along with the image reading unit 16. The roller units 19 are provided at both ends of the image reading unit 16. Roller faces of the roller units 19 remain in contact with a back surface 20 of the platen glass 10. Consequently, when the image reading unit 16 has moved along with movement of the carriage 17, the rollers of the roller unit 19 rotate along the platen glass 10. Since the roller units 19 are provided, the image reading unit 16 smoothly moves along the platen glass 10, although the image reading unit 16 is pressed against the back surface 20 of the platen glass 10. Further, the roller units 19 also play the role of constantly maintaining the distance between the platen glass 10 and the image reading unit 16. Consequently, even when the image reading unit 16 is formed from a CIS (Contact Image Sensor) having a low focal depth, the image of the document placed on the platen glass 10 is well read by the image reading unit 16.

When a reading command has been input by way of the control panel 6, the multifunction device 1 activates the belt drive mechanism to thus move the image reading unit 16 so as to slide over the guide shaft 18. The image reading unit 16, while moving, irradiates light on the document set on the platen glass 10 of the document reading table 8, and receives the light reflected form the document, thereby converting the received light into an electrical signal. The thus-converted electrical signal is read as image data pertaining to the document.

(Printer Section)

Figure 4:
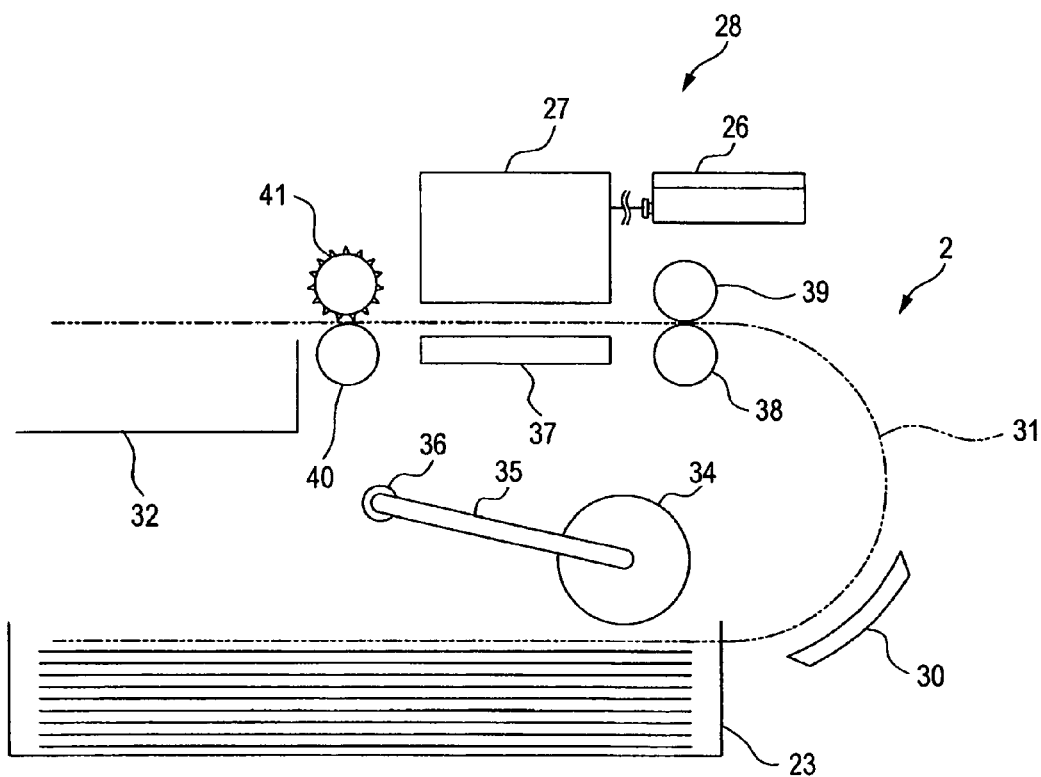
FIG. 4 is a schematic cross-sectional view showing a printer section.

As shown in FIG. 4, the printer section 2 has an image recording section 28 having an ink tank 26 and an inkjet recording head 27. The printer section 2 is formed as an inkjet recording device. A recording sheet storage cassette 23 is placed below the front of the printer section 2. Recording sheets on which images are to be formed are piled up in the recording sheet storage cassette 23. A separation tilted plate 30 is provided at a downstream side (i.e., on the right side of FIG. 4) with respect to the recording sheet storage cassette 23. The separation tilted plate 30 plays the role of separately guiding the recording sheets in the recording sheet storage cassette 23 upwardly one at a time in cooperation with a sheet-feeding roller 34 to be described later. A sheet transport path 31 is formed so as to extend upward of the separation tilted plate 30. After extending upwardly from the separation tilted plate 30, the sheet transport path 31 curves leftward in the sheet of FIG. 4, thereby extending from the rear to the front of the multifunction device 1. Moreover, the sheet transport path 31 passes through the image recording section 28 and extends to the recording sheet discharge tray 32. Consequently, the recording sheets housed in the recording sheet storage cassette 23 are guided one at a time so as to make a U turn from down to up by means of the sheet transport path 31, to thus arrive at the image recording section 28. After the image recording section 28 has recorded an image on the recording sheet in the middle of being transported along the sheet transport path 31, the recording sheet is discharged to the recording sheet output tray 32.

The sheet-feeding roller 34 is disposed at a position above the recording sheet storage cassette 23. In cooperation with the separation tilted plate 30, the sheet-feeding roller 34 separately picks up the recording sheets piled on the recording sheet storage cassette 23 one at a time and supplies the thus-picked sheet to the sheet transport path 31. The sheet-feeding roller 34 has a known structure. The present aspect adopts a structure where the sheet-feeding roller 34 is axially supported at a leading end of a sheet-feeding arm 35. The sheet-feeding roller 34 is vertically movable so as to bring the topmost sheet of the recording sheets piled on the sheet-feeding tray 23 into or out of contact with a roller face of the sheet-feeding roller 34. The sheet-feeding roller 34 is coupled with a motor via a drive transmission mechanism (not shown). The drive transmission mechanism may be configured by a plurality of gears meshing with each other. When the motor is driven, the driving force of the motor is transmitted to the sheet-feeding roller 34, and the sheet-feeding roller 34 rotates. By means of the rotated sheet-feeding roller 34, the recording sheet is picked up from the recording sheet storage cassette 23, and the thus-picked sheet is delivered to the sheet transport path 31.

The sheet-feeding arm 35 is supported by a base end shaft 36 and are pivotable about the base end shaft 36. Thus, the sheet-feeding arm 35 is vertically swingable about the base end shaft 36. The sheet-feeding arm 35 is urged toward the recording sheet storage cassette 23 by means of a sheet-feeding clutch (not shown), a spring, or the like, when the recording sheet storage cassette 23 is set in the multifunction device. When the recording sheet storage cassette 23 is removed, the sheet-feeding arm 35 is moved upward. Since the sheet-feeding arm 35 is pivoted downwardly, the sheet-feeding roller 34 supported at the leading end of the sheet-feeding arm 35 is brought into contact with the surface of the recording sheet in the recording sheet storage cassette 23.

When the sheet-feeding roller 34 rotates in that state, the topmost one of the recording sheets in the recording sheet storage cassette 23 is separated and fed one at a time in cooperation with the separation tilted plate 30. The thus-fed recording sheet is sent to the sheet transport path 31.

The image recording section 28 is disposed at a downstream position subsequent to the area of the sheet transport path 31 where the path makes a U-turn from down to up. A platen 37 is disposed opposite the inkjet recording head 27. The transported recording sheet is delivered to the platen 37. The inkjet recording head 27 ejects ink droplets over the recording sheet set on the platen 37. This inkjet recording head 27 is mounted on an carriage (not shown). This carriage is reciprocated in a direction perpendicular to the sheet of FIG. 4 by means of a motor. The inkjet recording head 27 ejects ink of colors on the recording sheet in the form of ink droplets while being reciprocated, whereby an image is recorded on the recording sheet.

A drive roller 38 and a press roller 39 are disposed in the sheet transport path 31 at a position upstream of the inkjet recording head 27, and a sheet-discharge roller 40 and a sheet-press roller 41 are disposed in the sheet transport path 31 at a position downstream of the inkjet recording head 27. The drive roller 38 and the sheet-discharge roller 40 are rotationally driven by an LF motor (not shown). By rotation of these rollers, the recording sheet is fed toward downstream of the sheet transport path 31. Transport of this recording sheet is monitored by a sheet transport encoder (not shown). Specifically, the sheet transport encoder has an encoder disk attached to a rotary shaft of the drive roller 38, another encoder disk attached to a rotary shaft of the sheet-discharge roller 40, and a photosensor for reading pulses output from the rotating encoder disks. Accordingly, the distance over which the recording sheet has been transported is determined by means of detecting the number of rotations of the drive roller 38 and the number of rotations of the sheet-discharge roller 40 through the use of the sheet transport encoder.

The press rollers 39, 41 are elastically urged so as to be pressed against the drive roller 38 and the sheet-discharge roller 40 at predetermined pressing force. Since the recording sheet is transported while being nipped by the respective rollers by means of the urging force, the rotational force of the rollers is firmly transmitted to the recording sheet. In the present aspect, as the press roller 41, which is brought into contact with the recorded recording sheet, a spur roller is employed so as to prevent deterioration of the image recorded on the recording sheet.

The recording sheet nipped between the drive roller 38 and the press roller 39 is intermittently transported over the platen 37 at a predetermined line feed pitch. Every time the recording sheet is subjected to line feeding, the inkjet recording head 27 is moved, and an image is recorded on the recording sheet from a leading edge thereof. The leading end of the recording sheet on which an image has been recorded is nipped between the sheet-discharge roller 40 and the press roller 41. Specifically, the recording sheet is intermittently transported at the predetermined line feed pitch while the leading end of the recording sheet is nipped between the sheet-discharge roller 40 and the press roller 41 and the trailing end of the same is nipped between the drive roller 38 and the press roller 39. While the recording sheet is being transported in this manner, the inkjet recording head 27 records an image. After an image has been recorded in a predetermined area of the recording sheet, the sheet-discharge roller 40 is rotationally driven consecutively, and the recording sheet nipped between the sheet-discharge roller 40 and the press roller 41 is discharged to the recording sheet discharge tray 32.

In the present aspect, an example where the printer section 2 is configured in the form of an inkjet recording device is described. The printer section 2 may be configured as a laser printer which causes toner to adhere to an electrostatic latent image formed on a photosensitive member by use of a laser beam, and to transfer the toner onto a recording sheet. Also, the printer section 2 may be configured as an analog electro-photographic image-forming device. Alternatively, the printer section 2 may be configured as a thermal image-forming device (a so-called thermal printer) which effects printing by means of subjecting a heat-sensitive sheet to thermal treatment to thus discolor the sheet.

Now, the cover 56 of the slot section 7 (see FIG. 1) will be described in detail with reference to FIGS. 6 through 10.

As shown in FIG. 6, the first through third insertion ports 61 to 63 are formed in the cover 56. The first insertion port 61 is a common opening used for inserting the SD (SD card) and the MS (a memory stick). As illustrated, a lower portion of the first insertion port 61 is formed to a size which is greater than at least the width of the SD, in order to enable insertion of the SD. The upper portion of the first insertion port 61 is formed to a size which is greater than at least the width of the MS in order to enable insertion of the MS. The second insertion port 62 is a common opening for insertion of the SM (SmartMedia) and XD (XD card). As in the case of the first insertion port 61, a lower portion of the second insertion port 62 is formed to a size which is greater than the width of the XD, and an upper portion of the same is formed to a size which is greater than the width of the SM. The third insertion port 63 is an opening used for insertion of only the CF (compact flash).

Figure 7:
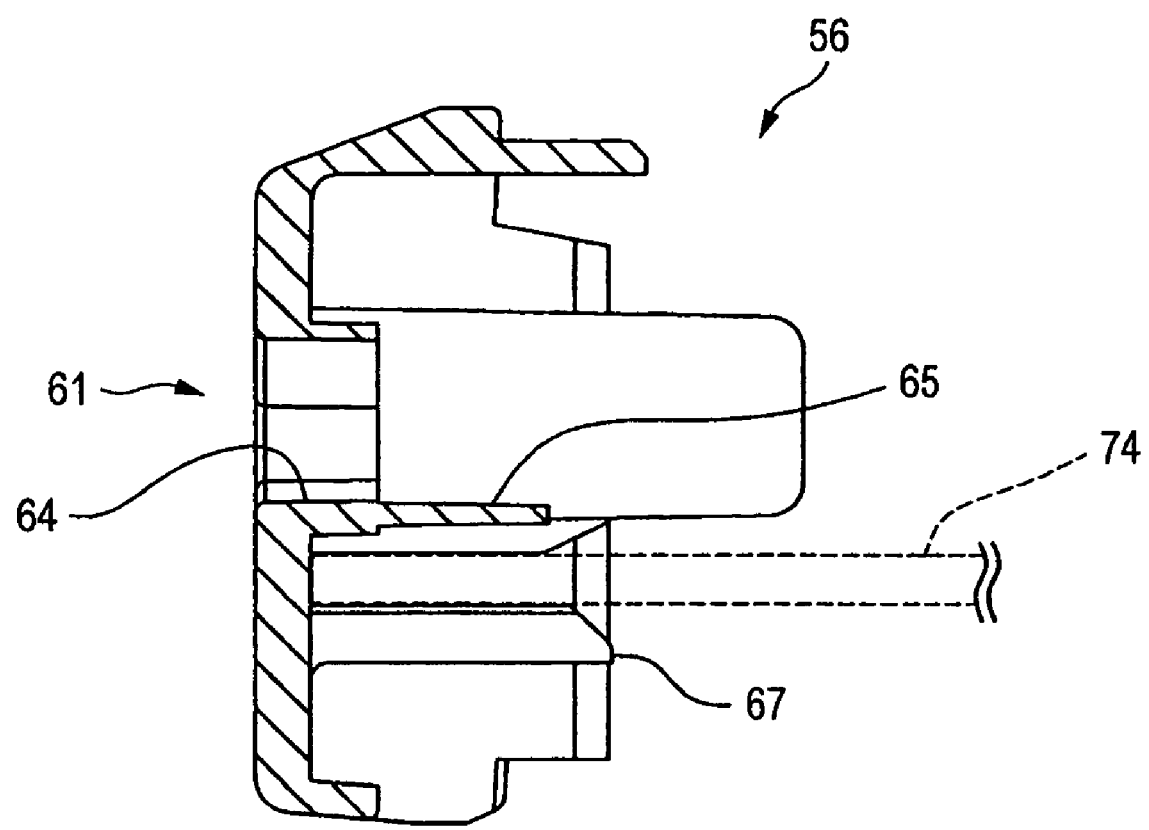
FIG. 7 is an enlarged cross-sectional view taken along line VII-VII shown in FIG. 6.
Figure 8:
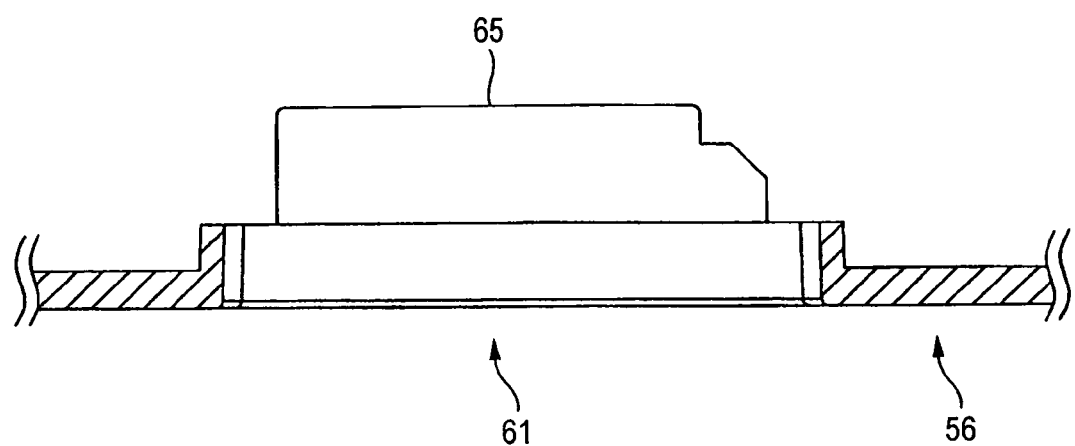
FIG. 8 is an enlarged cross-sectional view taken along line VIII-VIII shown in FIG. 6.
Figure 9:
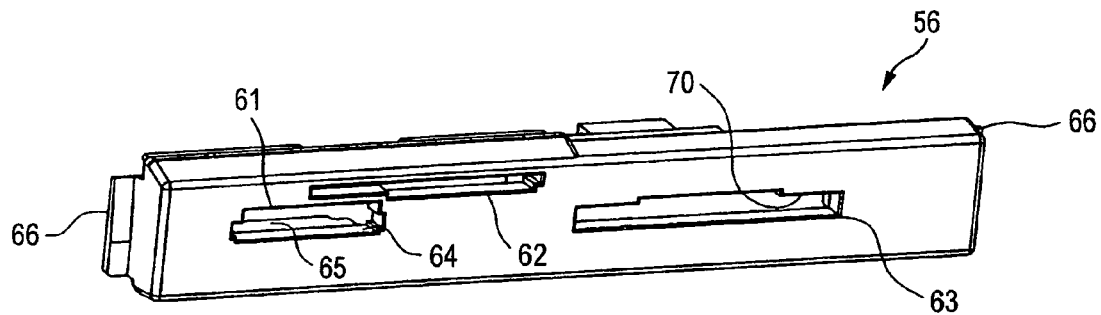
FIG. 9 is a perspective view of the cover when viewed from the front.

As shown in FIGS. 7 through 10, a flat-plate-like rib 65 (an example of a cover member) is formed on the back of the cover 56 so as to extend from a lower edge 64 of a lower side of the first insertion port 61 along a direction in which the memory card is inserted; namely, along a rightward direction in the sheet of FIG. 7. When the cover 56 is attached to the main body casing of the multifunction device 1, the rib 65 conceals a connection section between the socket 75 (see FIG. 11) into which the memory card is to be inserted and the control substrate 74 (see FIG. 11) on which the socket 75 is mounted. As a result, the connection section is covered, thereby preventing exposure of the connection section through the first insertion port 61.

The rib 65 also has a guide function of guiding insertion of the SD inserted into the first insertion port 61 to the first slot 52. Accordingly, there is no necessity for increasing the thickness of the cover 56 in order to additionally provide the guide function to the lower edge 64 of the first insertion port 61. Hence, the longitudinal outer dimension of the device (in the rearward direction of the device when viewed from the front) can be reduced by reducing the thickness of the cover 56.

An engagement lug 66 to be engaged with a groove (not shown) formed in the main body casing is formed at both ends in the lateral direction of the cover 56. As shown in FIG. 7, two fixtures 67 (see FIG. 10) are formed at horizontally-separated positions on the back of the cover 56. These fixtures 67 fasten the cover 56 to the control substrate 74 by nipping the control substrate 74 (see FIG. 11) when the cover 56 is fitted into the main body casing. When the fixtures 67 are fitted onto and fastened to the control substrate 74, the slots 51-55 formed in the sockets 75, 76 and the insertion ports 61-63 are positioned (see FIG. 13). FIG. 11 shows a state where the cover 56 is fixed to the control substrate 74 when the control substrate 74 is nipped between the fixtures 67. For the sake of convenience, FIG. 11 shows the control substrate 74, on which only the sockets 75, 76 are mounted on a mount face of the substrate, and electronic elements such as other semiconductor elements are not illustrated.

Figure 10:
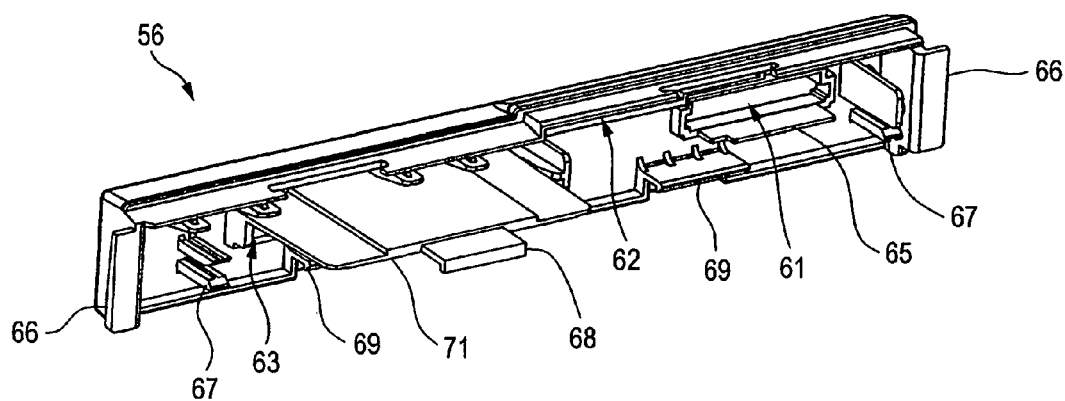
FIG. 10 is a perspective view of the cover when viewed from the inside thereof.
Figure 11:
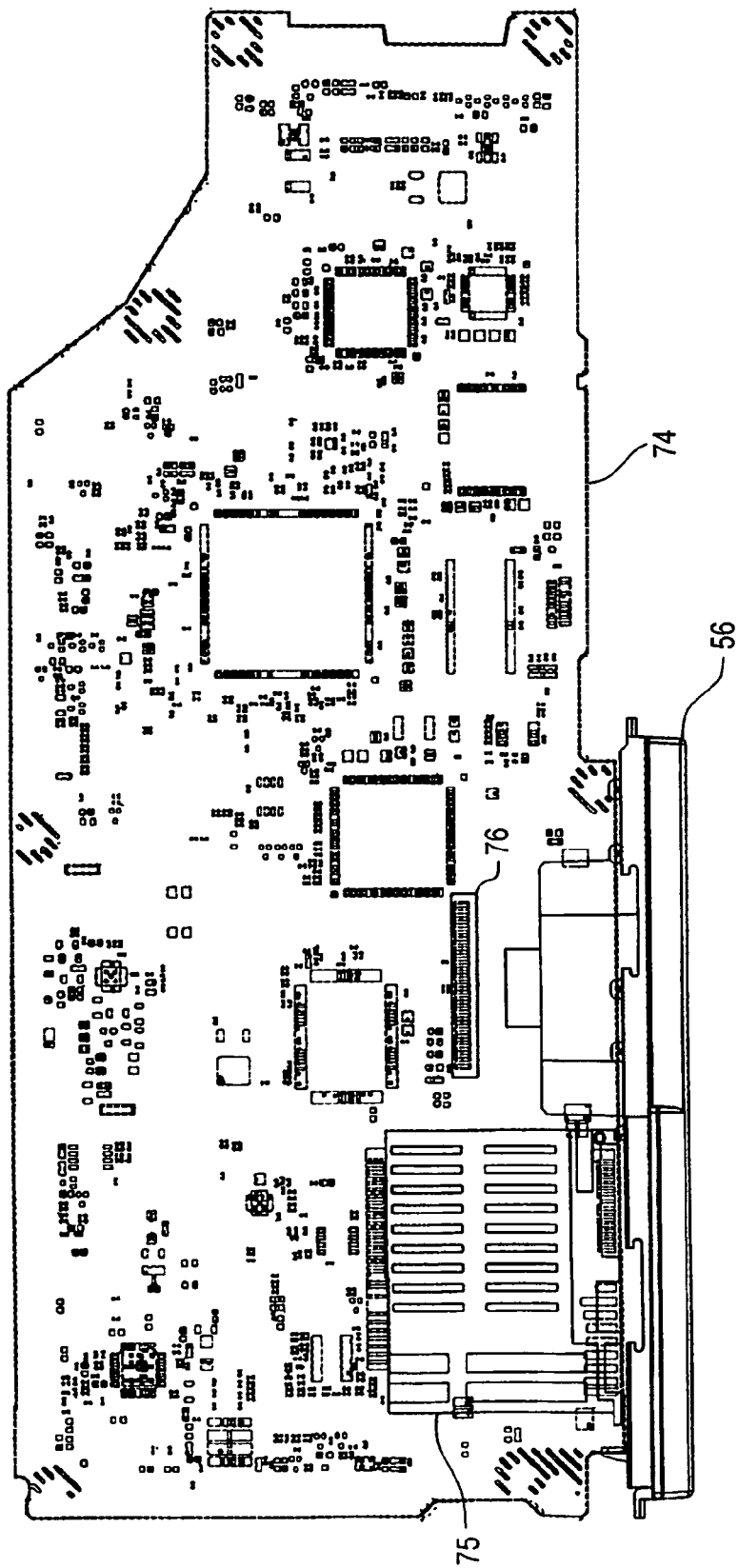
FIG. 11 is a plan view of a control substrate with the cover mounted thereto.

As shown in FIG. 10, a flat-plate-shaped rib 71, which extends from an upper edge 70 of the third insertion port 63 in a direction in which the memory card is to be inserted, is formed on the back of the cover 56. A hook-shaped latching element 68, which engages with the socket 76 mounted on the control board 74 (see FIG. 11) to thus fix the cover 56, is provided at a leading end of the rib 71. Another hook-shaped latching element 69 is provided at the lower end of the back of the cover 56. By means of these latching elements 68 and 69, fixing of the cover 56 and fitting of the cover 56 to the main body casing are made secure.

In the present aspect, the cover 56 is formed by means of molding a resin such as polyethylene (PE), polypropylene (PP), glass fiber reinforced plastic (FRP), ABS resin, or the like. Consequently, the rib 65 and the engagement lugs 66, which are provided on the cover 56, are formed integrally at the time of molding of the cover 56. Alternatively, the rib 65 and the engagement lugs 66 is not necessarily be formed integrally with the cover 56, but may be formed as separate members and fixed to the cover 56.

Figure 13:
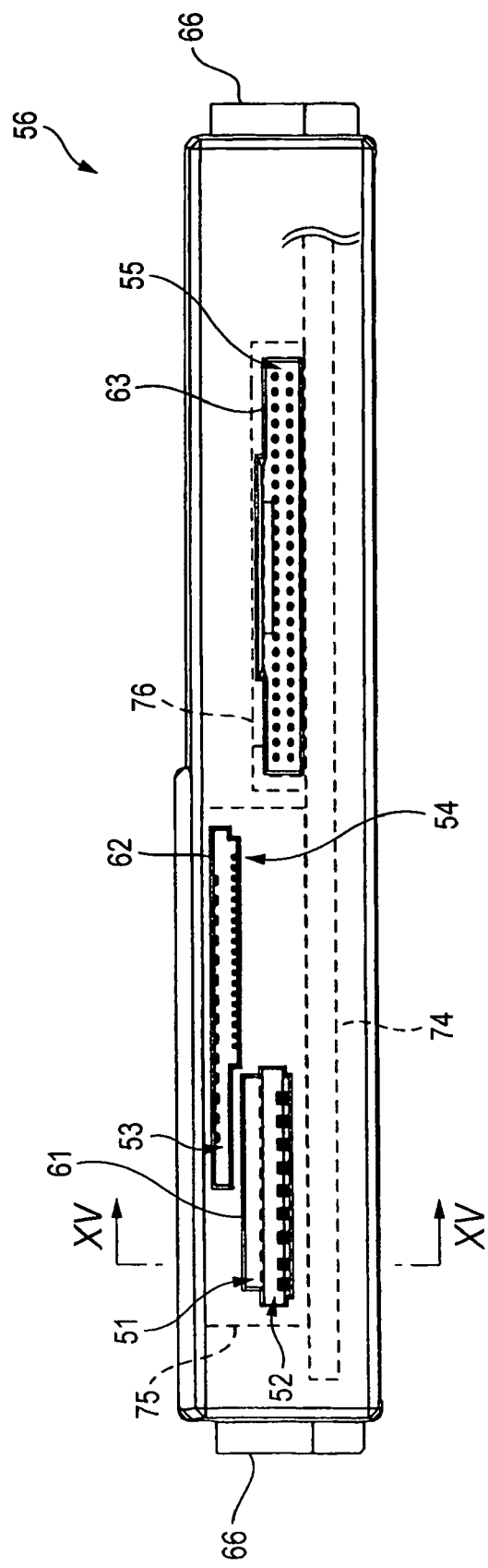
FIG. 13 is a front view of the cover fixed to the control substrate.
Figure 14:
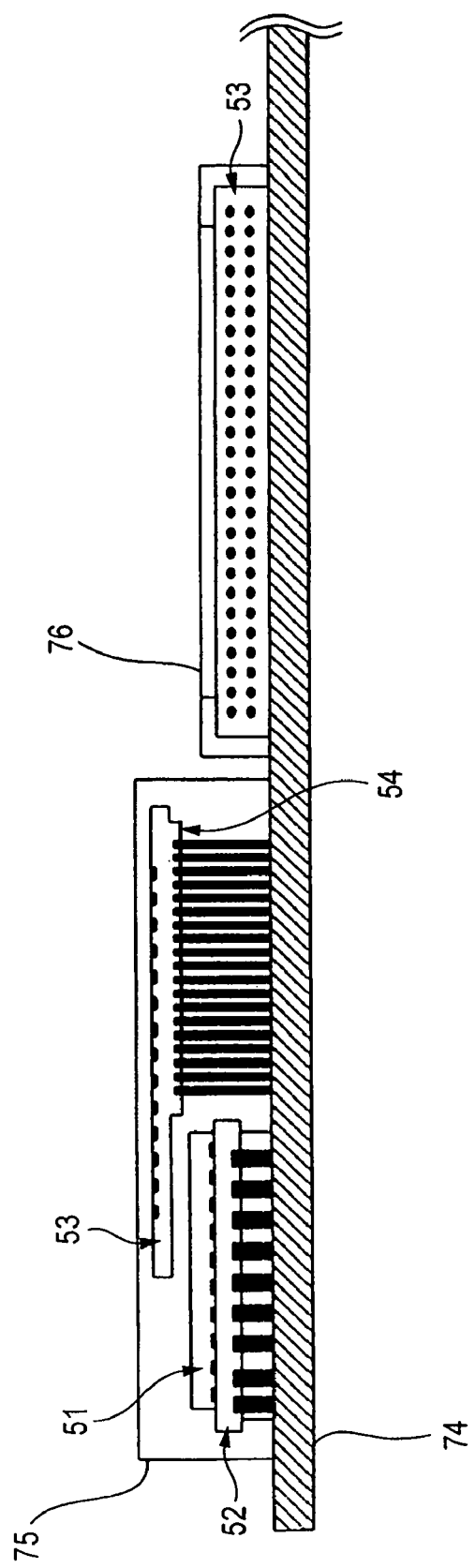
FIG. 14 is a front view of the sockets mounted on the control substrate.
Figure 15:
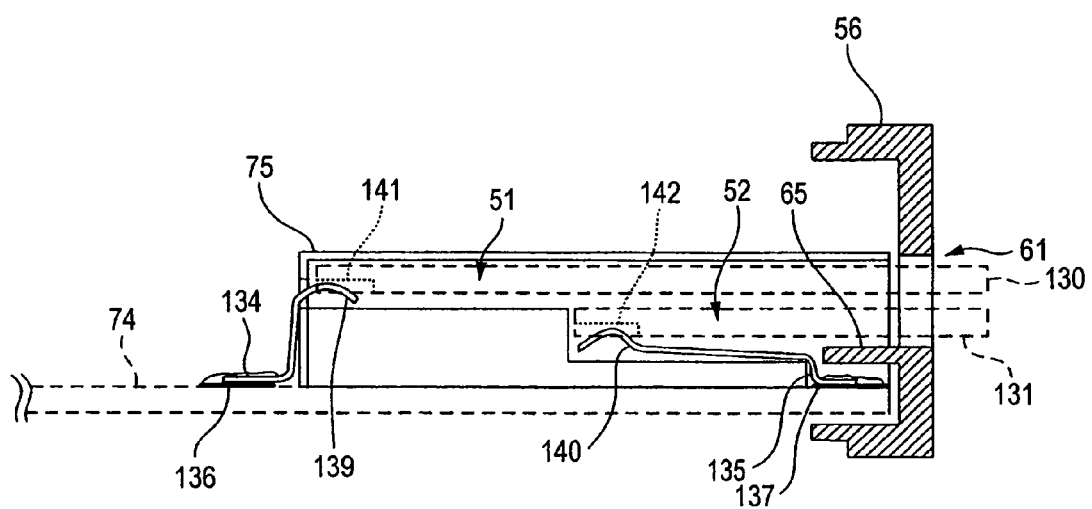
FIG. 15 is a schematic cross-sectional view taken along line XV-XV shown in FIG. 13.

As shown in FIGS. 13 to 15, the socket 75 is provided with the first through fourth slots 51 to 54. This socket 75 is for electrically relaying the memory card inserted into any of the first through fourth slots 51 to 54, to thus connect the memory card to the control board 74. The socket 76 is provided with a fifth slot 55. This socket 76 is for electrically relaying to the control substrate 74 a memory card inserted into the fifth slot 55.

As shown in FIG. 13, the first slot 51 and the second slot 52 are vertically arranged in two layers while being placed in close proximity to each other. The third slot 53 and the fourth slot 54 are also vertically arranged while being placed in close proximity to each other. Metal terminals 141 are formed at a leading end of the MS, which is to be inserted into the first slot 51, in the inserting direction thereof. Metal terminals 142 are formed at a leading end of the SD, which is to be inserted into the second slot 52, in the inserting direction thereof. When these memory cards are inserted into the respective slots, each of the metal terminals contacts a corresponding contact section 139 for the MS and a corresponding contact section 140 for the SD, which are provided at deep positions in the respective slots. As a result, the respective memory cards (MS and SD) are electrically and individually connected to the control substrate 74 by way of the single socket 75. Although not illustrated, the third slot 53 and the fourth slot 54 are also formed in the same manner as are the first slot 51 and the second slot 52.

Figure 12:
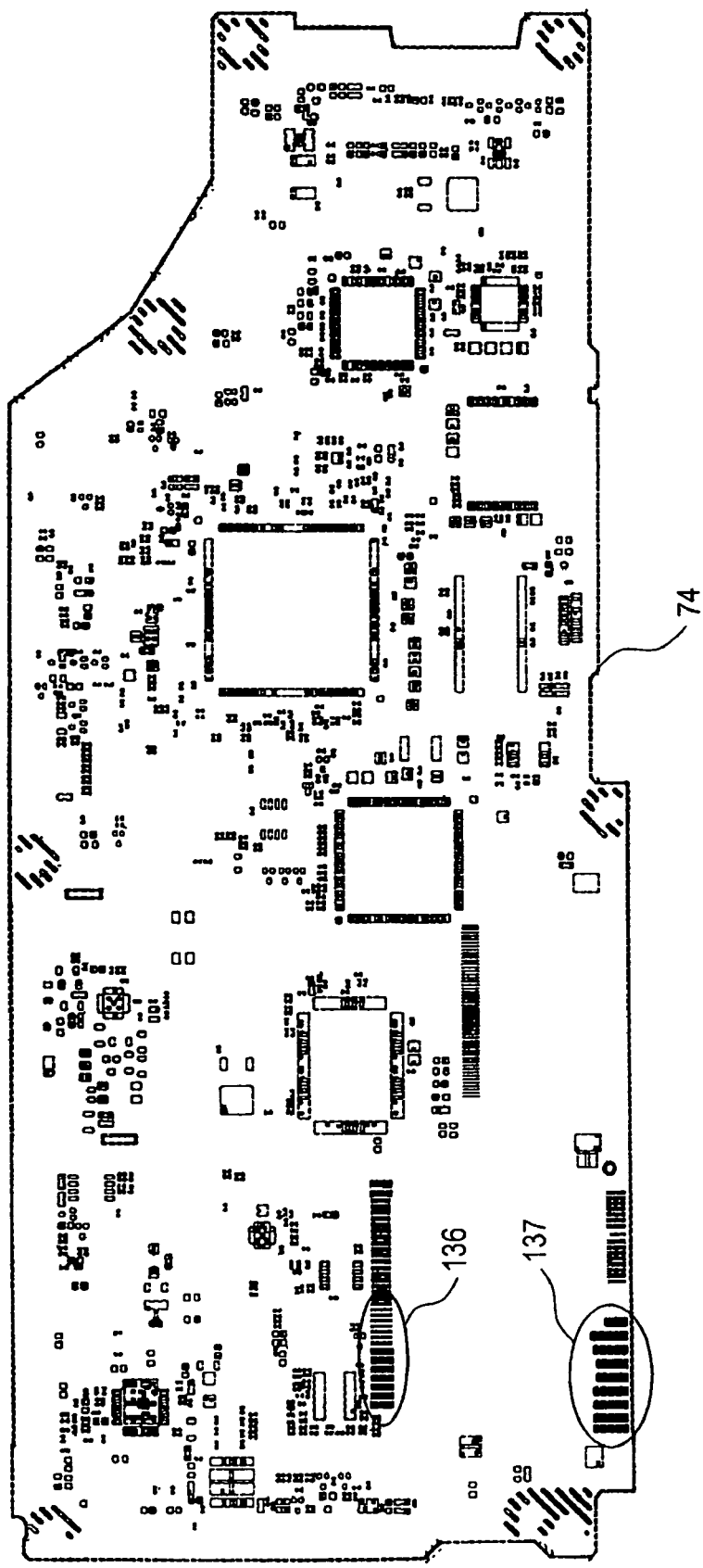
FIG. 12 is a plan view of the control substrate showing pattern terminals for sockets.

The MS inserted into the first slot 51 and the SD inserted into the second slot 52 differ in length from each other in the inserting direction. Therefore, the contact sections 139, 140 are arranged so as to be offset from each other in the inserting direction of the memory cards. Specifically, the MS is longer than the SD, and hence the contact sections 139 are provided at a position deeper with reference to the contact sections 140. Therefore, as shown in FIG. 15, each socket terminal 134 assigned to the MS is connected to a corresponding pattern terminal 136 at a position on the control substrate which is rearward of the socket 75. Each socket terminal 135 assigned to the SD is connected to a corresponding pattern terminal 137 at a position on the control substrate forward of the socket 75; namely, in the vicinity of the insertion port 61. FIG. 12 shows the pattern terminals 136, 137 formed on the control substrate 74.

In the multifunction device 1 according to the present aspect, when the cover 56 equipped with the rib 65 is fixed to the control substrate 74 on which is mounted the socket 75, connection sections between the socket terminals 135 and the pattern terminals 137 are covered by the rib 65, as shown in FIG. 15. Thus, by means of a simple structure where the rib 65 is provided on the cover 56, there can be effectively prevented discharge of static electricity to the connection sections, which would otherwise be caused when an electromagnetic wave or an electrically-charged body has approached the first insertion portion. When the memory card is inserted into the second slot 52, the memory card is inserted while being slid along the upper surface of the rib 65, thereby enabling smooth insertion of the memory card. Moreover, there is no necessity for increasing the thickness of the cover 56 to provide the guide function to the lower edge 64 of the first insertion port 61. The thickness of the cover 56 is reduced, to thus enable a reduction in the outer dimension of the device.

The above aspect has been described while the slot section 7 provided in the multifunction device 1 is taken as an example of the storage medium connecting device. Another example of the storage medium connecting device includes a peripheral device such as a reader/writer for reading/writing data from and in a memory card inserted into the slot. The present invention can also be applied to a cover which covers a plurality of slots formed in the peripheral device. As a matter of course, it goes without saying that the aspect can be altered, as appropriate, without departing from the scope of the present invention. Moreover, the present aspect has illustrated and described the inkjet-recording multifunction device 1 as an example of an information device. However, as mentioned previously, the information device may be a single-function device. Further, various recording systems can be adopted as an image recording system; e.g., an electrophotographic system, a laser recording system, a thermal transfer recording system, a micro-capsule failure system, a wire dot recording system, and the like. In addition, needless to say, the present invention can be applied to all kinds of information devices which handle various items of information (data) such as image data, document data, sound data, and motion picture data, and the like, so long as the information device enables attachment of a storage medium connecting device.

What is claimed is:

1. A storage medium connecting device comprising:
a substrate including an electrical circuit having conductive patterns, the conductive patterns including electrical terminals;
a socket mounted on the substrate and comprising a slot for receiving a card-type storage medium and a conductive member for electrically connecting the card-type storage medium to the substrate;
an exterior member having an insertion port for allowing the card-type storage medium to be detachably inserted into the slot of the socket; and
a cover member which extends from a proximal end located at an edge of the insertion port to a distal end in a direction of inserting the card-type storage medium,
wherein the conductive member of the socket includes a contact section for electrically contacting the card-type storage medium, and a connection section connected to a corresponding one of the electrical terminals of the substrate, the connection section being provided closer to the insertion port than the contact section,
wherein the distal end of the cover member is located between the connection section and the contact section such that the cover member covers the connection section provided closer to the insertion port than the contact section and does not cover the contact section,
wherein when the card-type storage medium is inserted into the slot of the socket, the cover member is located between the card-type storage medium and the substrate, and
wherein the cover member is spaced apart from the conductive member of the socket.

2. The storage medium connecting device according to claim 1, wherein the cover member guides the insertion of the card-type storage medium into the slot of the socket.

3. The storage medium connecting device according to claim 1, wherein the cover member is integrally formed with the exterior member.

4. The storage medium connecting device according to claim 3, wherein the exterior member and the cover member are integrally molded from resin.

5. The storage medium connecting device according to claim 1, wherein the insertion port is configured to allow insertion of a plurality of card-type storage media of different types into the socket, and each of the plurality of card-type storage media is electrically connected to the substrate individually via the socket.

6. The storage medium connecting device according to claim 5,
wherein the socket comprises a plurality of conductive members each including a contact section for electrically contacting a corresponding one of the plurality of card-type storage media,
wherein the contact sections are arranged offset from each other, in the inserting direction of the card-type storage media.

7. The storage medium connecting device according to claim 5, wherein the socket comprises a plurality of conductive members each including a connection section connected to a corresponding one of the electrical terminals of the substrate, the connection sections are arranged offset from each other in the inserting direction of the card-type storage media, and the cover member covers at least one of the connection sections which is provided closest to the insertion port.

8. An information device comprising:
a reading unit configured to read information stored in a card-type storage medium; and
a storage medium connecting device comprising:
a substrate including an electrical circuit having conductive patterns, the conductive patterns including electrical terminals;
a socket mounted on the substrate and comprising a slot for receiving the card-type storage medium and a conductive member for electrically connecting the card-type storage medium to the substrate;
an exterior member having an insertion port for allowing the card-type storage medium to be inserted into the slot of the socket; and
a cover member which extends from a proximal end located at an edge of the insertion port to a distal end in a direction of inserting the card-type storage medium,
wherein the conductive member of the socket includes a contact section for electrically contacting the card-type storage medium, and a connection section connected to a corresponding one of the electrical terminals of the substrate, the connection section being provided closer to the insertion port than the contact section,
wherein the distal end of the cover member is located between the connection section and the contact section such that the cover member covers the connection section provided closer to the insertion port than the contact section and does not cover the contact section, wherein when the card-type storage medium is inserted into the slot of the socket, the cover member is located between the card-type storage medium and the substrate, and wherein the cover member is spaced apart from the conductive member of the socket.

9. The information device according to claim 8, further comprising a display device that displays information read by the reading unit from the card-type storage medium.

10. The information device according to claim 8, further comprising a recording device that records information read by the reading unit from the card-type storage medium on a recording medium.

11. The storage medium connecting device according to claim 1, wherein the socket further comprises another slot for receiving another card-type storage medium and another conductive member for electrically connecting the another card-type storage medium to the substrate, the card-type storage medium and the another card-type storage medium being different in length in the inserting direction, wherein the another conductive member includes another connection section connected to a corresponding one of the electrical terminals of the substrate, and the connection section and the another connection section are offset from each other in the inserting direction, and wherein the cover member covers the connection section which is provided closer to the insertion port than the another connection section, and does not cover the another connection section.

12. The storage medium connection device according to claim 1, wherein the cover member guides one of opposite surfaces of the card-type storage medium, and the contact section electrically contacts the one of opposite surfaces that is guided by the cover member.

* * * * *